United States Patent
Xiong et al.

(10) Patent No.: US 10,855,407 B2
(45) Date of Patent: Dec. 1, 2020

(54) EXTENDED PHYSICAL BROADCAST CHANNEL DESIGN FOR 5G STANDALONE SYSTEM

(71) Applicant: Apple Inc., Cupertino, CA (US)

(72) Inventors: Gang Xiong, Beaverton, OR (US); Glenn J. Bradford, Hillsboro, OR (US); Bishwarup Mondal, San Jose, CA (US); Hong He, Beijing (CN); Jong-Kae Fwu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/099,629

(22) PCT Filed: Dec. 29, 2016

(86) PCT No.: PCT/US2016/069146
§ 371 (c)(1),
(2) Date: Nov. 7, 2018

(87) PCT Pub. No.: WO2017/196406
PCT Pub. Date: Nov. 16, 2017

(65) Prior Publication Data
US 2019/0149276 A1 May 16, 2019

Related U.S. Application Data

(60) Provisional application No. 62/333,701, filed on May 9, 2016.

(51) Int. Cl.
*H04L 1/18* (2006.01)
*H04L 5/00* (2006.01)
(Continued)

(52) U.S. Cl.
CPC .......... *H04L 1/1854* (2013.01); *H03M 13/09* (2013.01); *H04L 1/00* (2013.01); *H04L 1/1874* (2013.01);
(Continued)

(58) Field of Classification Search
None
See application file for complete search history.

(56) References Cited

U.S. PATENT DOCUMENTS 9,693,280 B2 * 6/2017 Ratasuk ................ H04W 16/32
10,038,534 B2 * 7/2018 Tong ...................... H04L 5/0025
(Continued)

OTHER PUBLICATIONS

"3GPP TSGRAN; E-UTRA", Physical channels and modulation (Release 13), (Mar. 29, 2016).
(Continued)

*Primary Examiner* — Bunjob Jaroenchonwanit
(74) *Attorney, Agent, or Firm* — Kowert, Hood, Munyon, Rankin & Goetzel, P.C.

(57) ABSTRACT

Devices and methods of receiving a PDCCH-less xSIB are generally described. A UE receive a xPBCH that occurs in a $0^{th}$ or a $25^{th}$ subframe and an ePBCH in an ePBCH transmission block. The ePBCH has the xSIB and is received on different Tx beams. The ePBCH spans consecutive symbols on the same subcarrier and with the same ePBCH symbol. The frame number, subframe number and symbol number of the ePBCH is dependent on a subframe number and symbol number of the xPBCH. The number of beams received for a particular symbol is dependent on a total number of beams, a beam sweeping time for the beams and a transmission periodicity of the xPBCH and ePBCH. The UE also uses different OCCs to demodulate a DMRS from different APs, in a same PRB as the ePBCH.

25 Claims, 7 Drawing Sheets

(51) Int. Cl.
  *H04L 1/00*  (2006.01)
  *H03M 13/09* (2006.01)
(52) U.S. Cl.
  CPC .......... *H04L 5/0007* (2013.01); *H04L 5/0048* (2013.01)

(56) References Cited

U.S. PATENT DOCUMENTS

| | | | | |
|---|---|---|---|---|
| 10,285,147 B2* | 5/2019 | Abedini | ............... | H04L 5/0005 |
| 10,454,606 B2* | 10/2019 | Xue | ............... | H04L 5/0053 |
| 2011/0026645 A1* | 2/2011 | Luo | ............... | H04L 1/0038 375/340 |
| 2011/0274102 A1* | 11/2011 | Kim | ............... | H04L 1/0072 370/350 |
| 2012/0033647 A1* | 2/2012 | Moon | ............... | H04W 74/006 370/336 |
| 2012/0182951 A1* | 7/2012 | Okubo | ............... | H04W 64/00 370/329 |
| 2014/0086173 A1* | 3/2014 | Sadeghi | ............... | H04L 5/005 370/329 |
| 2014/0177562 A1* | 6/2014 | Li | ............... | H04L 5/001 370/329 |
| 2014/0204851 A1* | 7/2014 | Chen | ............... | H04W 48/12 370/329 |
| 2014/0301305 A1* | 10/2014 | Xu | ............... | H04W 72/04 370/329 |
| 2014/0301353 A1* | 10/2014 | Frenne | ............... | H04L 5/003 370/330 |
| 2015/0078348 A1* | 3/2015 | Han | ............... | H04W 4/70 370/336 |
| 2015/0085793 A1* | 3/2015 | Luo | ............... | H04L 5/0048 370/329 |
| 2015/0103800 A1* | 4/2015 | Seo | ............... | H04W 48/10 370/330 |
| 2015/0124741 A1* | 5/2015 | Shieh | ............... | H04L 1/0007 370/329 |
| 2015/0280802 A1* | 10/2015 | Thomas | ............... | H04L 27/2636 370/312 |
| 2015/0296486 A1* | 10/2015 | Park | ............... | H04W 24/02 370/329 |
| 2016/0337817 A1* | 11/2016 | Malladi | ............... | H04W 4/06 |
| 2017/0111884 A1* | 4/2017 | Sadeghi | ............... | H04L 5/005 |
| 2017/0171866 A1* | 6/2017 | Cheng | ............... | H04L 5/0092 |
| 2017/0201968 A1* | 7/2017 | Nam | ............... | H04W 4/70 |
| 2017/0245165 A1* | 8/2017 | Onggosanusi | ............... | H04L 5/0048 |
| 2017/0288888 A1* | 10/2017 | Rico Alvarino | ............... | H04L 12/189 |
| 2017/0318559 A1* | 11/2017 | Islam | ............... | H04W 72/0453 |
| 2018/0040234 A1* | 2/2018 | Lo | ............... | H04W 4/90 |
| 2018/0309558 A1* | 10/2018 | Tong | ............... | H04L 5/0053 |
| 2018/0343091 A1* | 11/2018 | Xia | ............... | H04L 1/1861 |
| 2019/0028244 A1* | 1/2019 | Si | ............... | H04W 72/0446 |
| 2019/0028253 A1* | 1/2019 | Ahn | ............... | H04W 48/16 |
| 2019/0069218 A1* | 2/2019 | Ribeiro | ............... | H04W 48/12 |
| 2019/0081678 A1* | 3/2019 | Park | ............... | H04W 72/10 |
| 2019/0081827 A1* | 3/2019 | Ly | ............... | H04L 25/03866 |
| 2019/0149276 A1* | 5/2019 | Xiong | ............... | H03M 13/09 |
| 2019/0190576 A1* | 6/2019 | Chen | ............... | H04B 7/0615 |
| 2019/0200315 A1* | 6/2019 | Tsai | ............... | H04B 7/0617 |
| 2019/0215118 A1* | 7/2019 | Moles Cases | ............... | H04L 5/0048 |
| 2019/0313403 A1* | 10/2019 | Roh | ............... | H03M 13/611 |
| 2019/0357151 A1* | 11/2019 | Zhang | ............... | H04B 7/0404 |
| 2020/0015205 A1* | 1/2020 | Dinan | ............... | H04W 72/0446 |

OTHER PUBLICATIONS

"International Application Serial No. PCT/US2016/069146, International Search Report dated Apr. 17, 2017", 3 pgs.
"International Application Serial No. PCT/US2016/069146, Written Opinion dated Apr. 17, 2017", 10 pgs.

* cited by examiner

EXTENDED PHYSICAL BROADCAST CHANNEL DESIGN FOR 5G STANDALONE SYSTEM

PRIORITY CLAIM

This application is a U.S. National Stage Filing under 35 U.S.C. 371 from International Application No. PCT/US2016/069146, filed Dec. 29, 2016 and published in English as WO 2017/196406 on Nov. 16, 2017, which claims the benefit of priority to U.S. Provisional Patent Application Ser. No. 62/333,701, filed May 9, 2016, and entitled "EXTENDED PHYSICAL BROADCAST CHANNEL DESIGN FOR 5G STANDALONE SYSTEM," each of which is incorporated herein by reference in its entirety.

TECHNICAL FIELD

Embodiments pertain to radio access networks. Some embodiments relate to hybrid beamforming in cellular networks, including Third Generation Partnership Project Long Term Evolution (3GPP LTE) networks and LTE advanced (LTE-A) networks as well as $4^{th}$ generation (4G) networks and 5th generation (5G) networks. Some embodiments may relate to extended physical broadcast channel (ePBCH) design in 5G systems.

BACKGROUND

The use of 3GPP LTE systems (including LTE and LTE-Advanced systems) has increased due to both an increase in the types of devices user equipment (UEs) using network resources as well as the amount of data and bandwidth being used by various applications, such as video streaming, operating on these UEs. As a result, 3GPP LTE systems continue to develop, with the next generation wireless communication system, 5G, to improve access to information and data sharing. 5G looks to provide a unified network/system that is able to meet vastly different and sometime conflicting performance dimensions and services driven by disparate services and applications while maintaining compatibility with legacy UEs and applications.

Various techniques continue to be developed to increase the amount of data able to be conveyed between an evolved NodeB (eNB) or 5G NodeB (gNB) and UEs. In particular, the recent expansion of communications into mmWave and unlicensed spectrum bands has enabled the use of carrier aggregation (CA) in increasing the amount of data by increasing the data rate and/or the number of UEs serviced by the eNB. However, one of the issues with the use of mid-band frequencies (e.g., carrier frequencies of 6-30 GHz or 10-50 mm wavelength) and high-band frequencies (e.g., carrier frequencies of 30 GHz and above) is that signals of these frequencies may be subject to severe path loss, compared with lower, previously used frequencies (3 GHz or less), which can severely deteriorate signal strength and thereby damage performance of wireless communications employing those frequencies. In particular, the path loss caused by multipath and fading effects (caused by weather such as rain, fog, or physical blockage), can severely deteriorate the signal strength and damage the performance of the communications. The gain provided by beamforming may be used to compensate the severe path loss, and thereby improve coverage range, by directing radiation in narrow beam widths toward target UEs. The use of beamforming in mm frequency ranges may, however, be more problematic than in LTE band ranges. In particular, beam sweeping applied to control channels may result in increased system overhead, reducing efficiency. It would be desirable to maintain or increase system efficiency when multiple transmission beams are used in systems using higher frequency bands.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
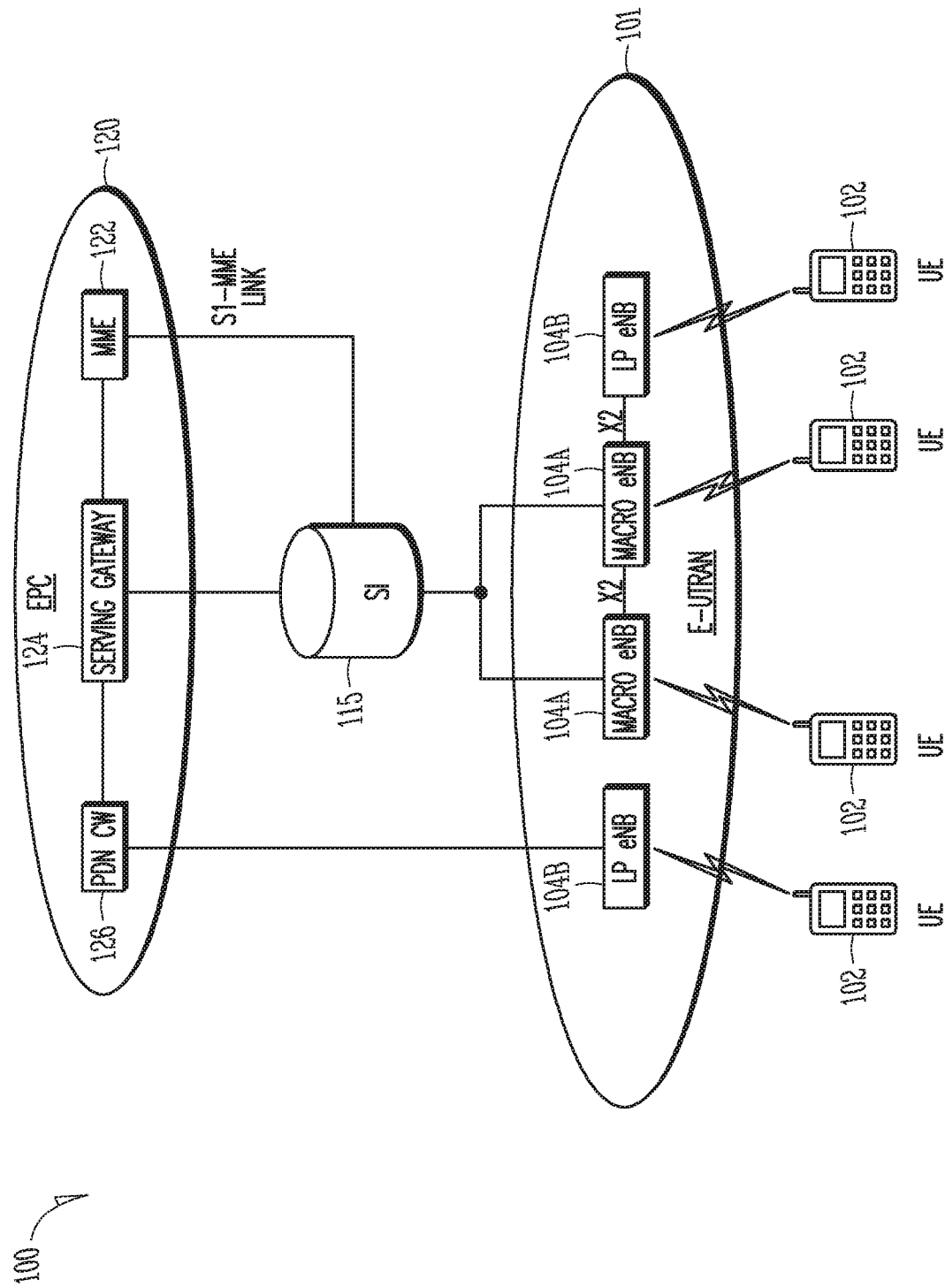
FIG. 1 is a functional diagram of a wireless network in accordance with some embodiments.

FIG. 1 shows an example of a portion of an end-to-end network architecture of a Long Term Evolution (LTE) network with various components of the network in accordance with some embodiments. As used herein, an LTE network refers to both LTE and LTE Advanced (LTE-A) networks as well as other versions of LTE networks to be developed. The network 100 may comprise a radio access network (RAN) (e.g., as depicted, the E-UTRAN or evolved universal terrestrial radio access network) 101 and core network 120 (e.g., shown as an evolved packet core (EPC)) coupled together through an S1 interface 115. For convenience and brevity, only a portion of the core network 120, as well as the RAN 101, is shown in the example.

The core network 120 may include a mobility management entity (MME) 122, serving gateway (serving GW) 124, and packet data network gateway (PDN GW) 126. The RAN 101 may include evolved node Bs (eNBs) 104 (which may operate as base stations) for communicating with user equipment (UE) 102. The eNBs 104 may include macro eNBs 104a and low power (LP) eNBs 104b. The eNBs 104 and UEs 102 may employ the techniques as described herein.

The MME 122 may be similar in function to the control plane of legacy Serving GPRS Support Nodes (SGSN). The MME 122 may manage mobility aspects in access such as gateway selection and tracking area list management. The serving GW 124 may terminate the interface toward the RAN 101, and route data packets between the RAN 101 and the core network 120. In addition, the serving GW 124 may be a local mobility anchor point for inter-eNB handovers and also may provide an anchor for inter-3GPP mobility. Other responsibilities may include lawful intercept, charging, and some policy enforcement. The serving GW 124 and the MME 122 may be implemented in one physical node or separate physical nodes.

The PDN GW 126 may terminate a SGi interface toward the packet data network (PDN). The PDN GW 126 may route data packets between the EPC 120 and the external PDN, and may perform policy enforcement and charging data collection. The PDN GW 126 may also provide an anchor point for mobility devices with non-LTE access. The external PDN can be any kind of IP network, as well as an IP Multimedia Subsystem (IMS) domain. The PDN GW 126 and the serving GW 124 may be implemented in a single physical node or separate physical nodes.

The eNBs 104 (macro and micro) may terminate the air interface protocol and may be the first point of contact for a UE 102. In some embodiments, an eNB 104 may fulfill various logical functions for the RAN 101 including, but not limited to, RNC (radio network controller functions) such as radio bearer management, uplink and downlink dynamic radio resource management and data packet scheduling, and mobility management. In accordance with embodiments, UEs 102 may be configured to communicate orthogonal frequency division multiplexed (OFDM) communication signals with an eNB 104 over a multicarrier communication channel in accordance with an OFDMA communication technique. The OFDM signals may comprise a plurality of orthogonal subcarriers.

The S1 interface 115 may be the interface that separates the RAN 101 and the EPC 120. It may be split into two parts: the S1-U, which may carry traffic data between the eNBs 104 and the serving GW 124, and the S1-MME, which may be a signaling interface between the eNBs 104 and the MME 122. The X2 interface may be the interface between eNBs 104. The X2 interface may comprise two parts, the X2-C and X2-U. The X2-C may be the control plane interface between the eNBs 104, while the X2-U may be the user plane interface between the eNBs 104.

With cellular networks, LP cells 104b may be typically used to extend coverage to indoor areas where outdoor signals do not reach well, or to add network capacity in areas with dense usage. In particular, it may be desirable to enhance the coverage of a wireless communication system using cells of different sizes, macrocells, microcells, picocells, and femtocells, to boost system performance. The cells of different sizes may operate on the same frequency band, or may operate on different frequency bands with each cell operating in a different frequency band or only cells of different sizes operating on different frequency bands. As used herein, the term LP eNB refers to any suitable relatively LP eNB for implementing a smaller cell (smaller than a macro cell) such as a femtocell, a picocell, or a microcell. Femtocell eNBs may be typically provided by a mobile network operator to its residential or enterprise customers. A femtocell may be typically the size of a residential gateway or smaller and generally connect to a broadband line. The femtocell may connect to the mobile operator's mobile network and provide extra coverage in a range of typically 30 to 50 meters. Thus, a LP eNB 104b might be a femtocell eNB since it is coupled through the PDN GW 126. Similarly, a picocell may be a wireless communication system typically covering a small area, such as in-building (offices, shopping malls, train stations, etc.), or more recently in-aircraft. A picocell eNB may generally connect through the X2 link to another eNB such as a macro eNB through its base station controller (BSC) functionality. Thus, LP eNB may be implemented with a picocell eNB since it may be coupled to a macro eNB 104a via an X2 interface. Picocell eNBs or other LP eNBs LP eNB 104b may incorporate some or all functionality of a macro eNB LP eNB 104a. In some cases, this may be referred to as an access point base station or enterprise femtocell.

Communication over an LTE network may be split up into 10 ms radio frames, each of which may contain ten 1 ms subframes. Each subframe of the frame, in turn, may contain two slots of 0.5 ms. Each subframe may be used for uplink (UL) communications from the UE 102 to the eNB 104 or downlink (DL) communications from the eNB 104 to the UE. In one embodiment, the eNB 104 may allocate a greater number of DL communications than UL communications in a particular frame. The eNB 104 may schedule transmissions over a variety of frequency bands. Each slot of the subframe may contain 6-7 OFDM symbols, depending on the system used. In one embodiment, each subframe may contain 12 subcarriers. In the 5G system, however, the frame size (ms) and number of subframes within a frame may be different from that of a 4G or LTE system. The subframe size may also vary in the 5G system from frame to frame. In some embodiments, the 5G system may span 5 times the frequency of the LTE/4G system, in which case the frame size of the 5G system may be 5 times smaller than that of the LTE/4G system.

A downlink resource grid may be used for downlink transmissions from an eNB 104 to a UE 102, while an uplink resource grid may be used for uplink transmissions from a UE 102 to an eNB 104 or from a UE 102 to another UE 102. The resource grid may be a time-frequency grid, which is the physical resource in the downlink in each slot. The smallest time-frequency unit in a resource grid may be denoted as a resource element (RE). Each column and each row of the resource grid may correspond to one OFDM symbol and one OFDM subcarrier, respectively. The resource grid may contain resource blocks (RBs) that describe the mapping of physical channels to resource elements and physical RBs (PRBs). A PRB may be the smallest unit of resources that can be allocated to a UE. A RB in some embodiments may be 180 kHz wide in frequency and 1 slot long in time. In frequency, RBs may be either 12×15 kHz subcarriers or 24×7.5 kHz subcarriers wide, dependent on the system bandwidth. In Frequency Division Duplexing (FDD) systems, both the uplink and downlink frames may be 10 ms and frequency (full-duplex) or time (half-duplex) separated. In TDD systems, the uplink and downlink subframes may be transmitted on the same frequency and are multiplexed in the time domain. The duration of the resource grid 400 in the time domain corresponds to one subframe or two resource blocks. Each resource grid may comprise 12 (subcarriers) *14 (symbols)=168 resource elements.

TDD systems may include UL, DL and, unlike FDD systems, special subframes due to the time-division aspect of the system when switching between UL and DL subframes. In particular, the special subframe may be preceded by a DL or UL subframe (and succeeded by a subframe of the opposite type) and may include both a UL and DL control region. A guard period may be reserved at the initiation of the special subframe to permit the UE 102 to switch between the receiver and transmitter chain.

Each OFDM symbol may contain a cyclic prefix (CP) which may be used to effectively eliminate Inter Symbol Interference (ISI), and a Fast Fourier Transform (FFT) period. The duration of the CP may be determined by the highest anticipated degree of delay spread. Although distortion from the preceding OFDM symbol may exist within the CP, with a CP of sufficient duration, preceding OFDM symbols do not enter the FFT period. Once the FFT period signal is received and digitized, the receiver may ignore the signal in the CP.

There may be several different physical downlink channels that are conveyed using such resource blocks, including the physical downlink control channel (PDCCH) and the physical downlink shared channel (PDSCH) in LTE or 4G systems and the 5G physical downlink control channel (xPDCCH) and the 5G physical downlink shared channel (xPDSCH). Each 5G downlink subframe may be partitioned into the xPDCCH and the PDSCH. The xPDCCH may occupy the first two symbols of each subframe and carry, among other information, information about the transport format and resource allocations related to the xPDSCH channel, as well as allocation and H-ARQ information related to the 5G uplink shared channel (xPUSCH). The xPDSCH may carry user data and higher layer signaling to a UE and, in some embodiments, occupy the remainder of the subframe. Typically, downlink scheduling (assigning control and shared channel resource blocks to UEs within a cell) may be performed at the eNB based on channel quality information provided from the UEs to the eNB, and then the downlink resource assignment information may be sent to each UE on the xPDCCH used for (assigned to) the UE. The xPDCCH may contain downlink control information (DCI) in one of a number of formats that indicate to the UE how to find and decode data, transmitted on the xPDSCH in the same subframe, from the resource grid. The DCI format may provide details such as the resource block assignment (number of resource blocks, resource allocation type), Modulation and Coding Scheme (MCS), redundancy version, etc. Each DCI format may have a cyclic redundancy code (CRC) and be scrambled with a Radio Network Temporary Identifier (RNTI) that identifies the target UE for which the xPDSCH is intended. Use of the UE-specific RNTI may limit decoding of the DCI format (and hence the corresponding xPDSCH) to only the intended UE.

In LTE, the eNB 104 may transmit a primary synchronization signal (PSS) and a secondary synchronization signal (SSS) in the center 1.08 MHz of the system bandwidth for cell search and acquisition by the UE 102. The PSS and SSS may be transmitted in symbol periods 6 and 5, respectively, in subframes 0 and 5 of each radio frame with a normal cyclic prefix. A cell-specific reference signal (CRS) transmitted by the eNB in symbol periods (symbols 0, 4, 7 and 11) of each subframe may be used for acquisition, demodulation and channel quality estimation. The CRS reference signal may be generated based on a cell identity (ID) and thus cell-specific, and transmitted on evenly spaced subcarriers as determined based on the cell ID. A physical broadcast channel (PBCH) carrying system information may be transmitted in symbol periods 0 to 3 in slot 1 of particular radio frames. In 5G systems, the 5G PBCH (xPBCH) may be transmitted in the $0^{th}$ and $25^{th}$ subframe. The xPBCH may be a downlink only channel.

The PBCH may indicate a CRS antenna configuration via different CRC masks. The PBCH may be transmitted every frame in four consecutive transmission opportunities. The PBCH may be transmitted using the first four OFDM symbols in the second slot of subframe 0 in the center 6 RBs, excluding the REs used by the CRS.

In addition to the PDCCH (or xPDCCH), an enhanced PDCCH (EPDCCH) may be used by the eNB 104 and UE 102. Unlike the PDCCH, the EPDCCH may be disposed in the resource blocks normally allocated for the PDSCH. Different UEs may have different EPDCCH configurations that are configured via Radio Resource Control (RRC) signaling. Each UE 102 may be configured with sets of EPDCCHs, and the configuration can also be different between the sets. Each EPDCCH set may have 2, 4, or 8 PRB pairs. In some embodiments, resource blocks configured for EPDCCHs in a particular subframe may be used for PDSCH transmission if the resource blocks are not used for the EPDCCH transmissions during the subframe.

In order to enable retransmission of missing or erroneous data, the Hybrid Automatic Repeat Request (HARQ) scheme may be used to provide the feedback on success or failure of a decoding attempt to the transmitter after each received data block. When an eNB 104 sends data to the UE 102 in a PDSCH, the data packets may be sent together with indicators in a PDCCH in the same subframe that inform the UE 102 about the scheduling of the PDSCH, including the transmission time and other scheduling information of the transmitted data. For each PDSCH codeword that the UE 102 receives, the UE 102 may respond with an ACK when the codeword is successfully decoded, or a NACK when the codeword is not successfully decoded. The eNB 104 may expect the ACK/NACK feedback after a predetermined number of subframes from the subframe in which the PDSCH data is sent. Upon receiving a NACK from the UE 102, the eNB 104 may retransmit the transport block or skip the retransmission if the retransmission number exceeds a maximum value. The ACK/NACK for the corresponding the PDSCH may be transmitted by the UE four subframes after the PDSCH is received from the eNB 104. Depending on the number of codewords present, HARQ-ACK information corresponding to a PDSCH may contain, for example, 1 or 2 information bits (DCI formats 1a and 1b, respectively). The HARQ-ACK bits may then be processed, as per the PUCCH.

In some embodiments, the network may use Time Division Duplexing (TDD). TDD subframes may be UL subframes, DL subframes or special subframes. For example, a 5G TDD special subframe may include an xPDCCH, an xPDSCH, a guard period (GP), and an xPUCCH. The xPDSCH transmission may be scheduled by the xPDCCH transmission and may occur immediately subsequent to the xPDCCH transmission. A UE may decode the xPDSCH transmission, after which the UE may provide an ACK or NACK as feedback in xPUCCH transmission. The GP between the xPDSCH transmission and xPUCCH transmission may accommodate DL-to-UL and/or UL-to-DL switching times and/or round-trip propagation delays.

Figure 2:
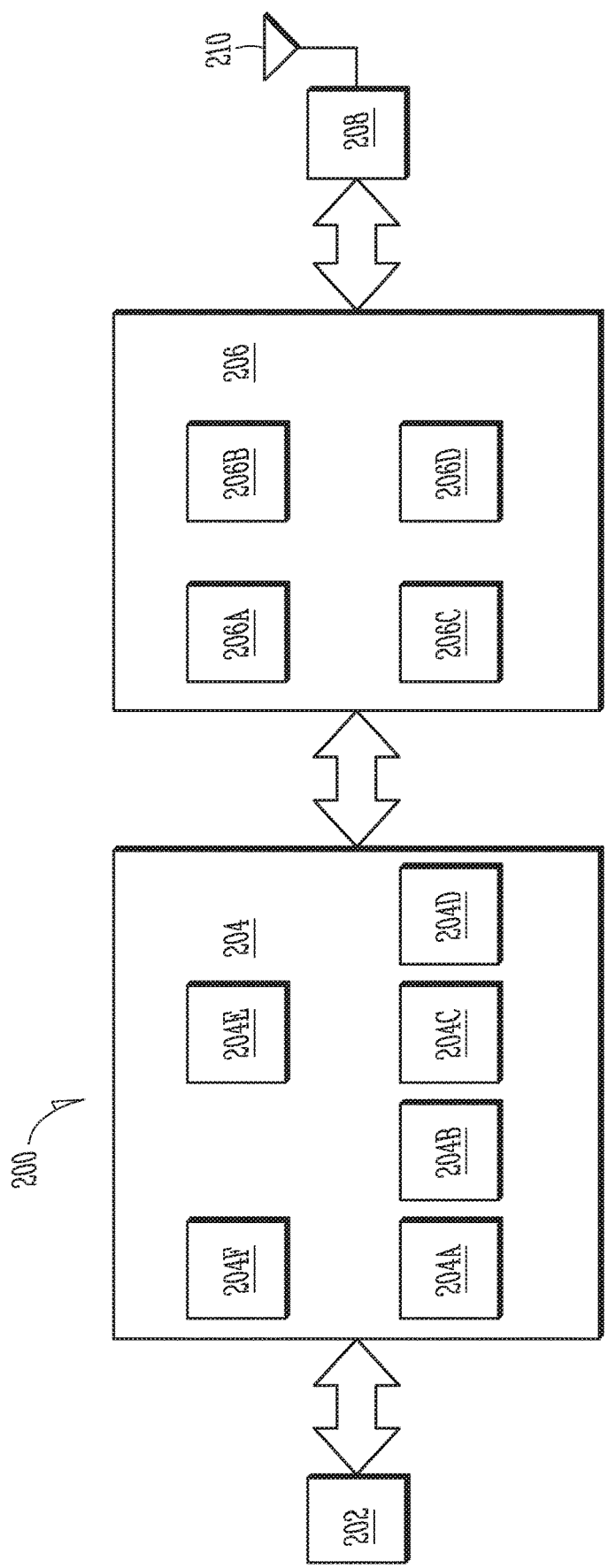
FIG. 2 illustrates components of a communication device in accordance with some embodiments.

Embodiments described herein may be implemented into a system using any suitably configured hardware and/or software. FIG. 2 illustrates components of a UE in accordance with some embodiments. At least some of the components shown may be used in the UE 102 (or eNB 104) shown in FIG. 1. The UE 200 may be one of the UEs 102 shown in FIG. 1 and may be a stationary, non-mobile device or may be a mobile device. In some embodiments, the UE 200 may include application circuitry 202, baseband circuitry 204, Radio Frequency (RF) circuitry 206, front-end module (FEM) circuitry 208 and one or more antennas 210, coupled together at least as shown. At least some of the baseband circuitry 204, RF circuitry 206, and FEM circuitry 208 may form a transceiver. In some embodiments, other network elements, such as the eNB may contain some or all of the components shown in FIG. 2. Other of the network elements, such as the MME, may contain an interface, such as the S1 interface, to communicate with the eNB over a wired connection regarding the UE.

The application or processing circuitry 202 may include one or more application processors. For example, the application circuitry 202 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 204 may include circuitry such as, but not limited to, one or more single-core or multi-core processors. The baseband circuitry 204 may include one or more baseband processors and/or control logic to process baseband signals received from a receive signal path of the RF circuitry 206 and to generate baseband signals for a transmit signal path of the RF circuitry 206. Baseband processing circuitry 204 may interface with the application circuitry 202 for generation and processing of the baseband signals and for controlling operations of the RF circuitry 206. For example, in some embodiments, the baseband circuitry 204 may include a second generation (2G) baseband processor 204a, third generation (3G) baseband processor 204b, fourth generation (4G) baseband processor 204c, and/or other baseband processor(s) 204d for other existing generations, generations in development or to be developed in the future (e.g., fifth generation (5G), 5G, etc.). The baseband circuitry 204 (e.g., one or more of baseband processors 204a-d) may handle various radio control functions that enable communication with one or more radio networks via the RF circuitry 206. The radio control functions may include, but are not limited to, signal modulation/demodulation, encoding/decoding, radio frequency shifting, etc. In some embodiments, modulation/demodulation circuitry of the baseband circuitry 204 may include FFT, precoding, and/or constellation mapping/demapping functionality. In some embodiments, encoding/decoding circuitry of the baseband circuitry 204 may include convolution, tail-biting convolution, turbo. Viterbi. and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 204 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 204e of the baseband circuitry 204 may be configured to run elements of the protocol stack for signaling of the PHY, MAC, RLC, PDCP and/or RRC layers. In some embodiments, the baseband circuitry may include one or more audio digital signal processor(s) (DSP) 204f. The audio DSP(s) 204f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 204 and the application circuitry 202 may be implemented together such as, for example, on a system on a chip (SOC).

In some embodiments, the baseband circuitry 204 may provide for communication compatible with one or more radio technologies. For example, in some embodiments, the baseband circuitry 204 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 204 is configured to support radio communications of more than one wireless protocol may be referred to as multi-mode baseband circuitry. In some embodiments, the device can be configured to operate in accordance with communication standards or other protocols or standards, including Institute of Electrical and Electronic Engineers (IEEE) 802.16 wireless technology (Wi-Max), IEEE 802.11 wireless technology (WiFi) including IEEE 802.11 ad, which operates in the 60 GHz millimeter wave spectrum, various other wireless technologies such as global system for mobile communications (GSM), enhanced data rates for GSM evolution (EDGE). GSM EDGE radio access network (GERAN), universal mobile telecommunications system (UMTS), UMTS terrestrial radio access network (UTRAN), or other 2G, 3G, 4G, 5G, etc. technologies either already developed or to be developed.

RF circuitry 206 may enable communication with wireless networks using modulated electromagnetic radiation through a non-solid medium. In various embodiments, the RF circuitry 206 may include switches, filters, amplifiers, etc. to facilitate the communication with the wireless network. RF circuitry 206 may include a receive signal path which may include circuitry to down-convert RF signals received from the FEM circuitry 208 and provide baseband signals to the baseband circuitry 204. RF circuitry 206 may also include a transmit signal path which may include circuitry to up-convert baseband signals provided by the baseband circuitry 204 and provide RF output signals to the FEM circuitry 208 for transmission.

In some embodiments, the RF circuitry 206 may include a receive signal path and a transmit signal path. The receive signal path of the RF circuitry 206 may include mixer circuitry 206a, amplifier circuitry 206b and filter circuitry 206c. The transmit signal path of the RF circuitry 206 may include filter circuitry 206c and mixer circuitry 206a. RF circuitry 206 may also include synthesizer circuitry 206d for synthesizing a frequency for use by the mixer circuitry 206a of the receive signal path and the transmit signal path. In some embodiments, the mixer circuitry 206a of the receive signal path may be configured to down-convert RF signals received from the FEM circuitry 208 based on the synthesized frequency provided by synthesizer circuitry 206d. The amplifier circuitry 206b may be configured to amplify the down-converted signals and the filter circuitry 206c may be a low-pass filter (LPF) or band-pass filter (BPF) configured to remove unwanted signals from the down-converted signals to generate output baseband signals. Output baseband signals may be provided to the baseband circuitry 204 for further processing. In some embodiments, the output baseband signals may be zero-frequency baseband signals, although this is not a requirement. In some embodiments, mixer circuitry 206a of the receive signal path may comprise passive mixers, although the scope of the embodiments is not limited in this respect.

In some embodiments, the mixer circuitry 206a of the transmit signal path may be configured to up-convert input baseband signals based on the synthesized frequency provided by the synthesizer circuitry 206d to generate RF output signals for the FEM circuitry 208. The baseband signals may be provided by the baseband circuitry 204 and may be filtered by filter circuitry 206c. The filter circuitry 206c may include a low-pass filter (LPF), although the scope of the embodiments is not limited in this respect.

In some embodiments, the mixer circuitry 206a of the receive signal path and the mixer circuitry 206a of the transmit signal path may include two or more mixers and may be arranged for quadrature downconversion and/or upconversion respectively. In some embodiments, the mixer circuitry 206a of the receive signal path and the mixer circuitry 206a of the transmit signal path may include two or more mixers and may be arranged for image rejection (e.g., Hartley image rejection). In some embodiments, the mixer circuitry 206a of the receive signal path and the mixer circuitry 206a may be arranged for direct downconversion and/or direct upconversion, respectively. In some embodiments, the mixer circuitry 206a of the receive signal path and the mixer circuitry 206a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 206 may include analog-to-digital converter (ADC) and digital-to-analog converter (DAC) circuitry and the baseband circuitry 204 may include a digital baseband interface to communicate with the RF circuitry 206.

In some dual-mode embodiments, a separate radio IC circuitry may be provided for processing signals for each spectrum, although the scope of the embodiments is not limited in this respect.

In some embodiments, the synthesizer circuitry 206d may be a fractional-N synthesizer or a fractional N/N+1 synthesizer, although the scope of the embodiments is not limited in this respect as other types of frequency synthesizers may be suitable. For example, synthesizer circuitry 206d may be a delta-sigma synthesizer, a frequency multiplier, or a synthesizer comprising a phase-locked loop with a frequency divider.

The synthesizer circuitry 206d may be configured to synthesize an output frequency for use by the mixer circuitry 206a of the RF circuitry 206 based on a frequency input and a divider control input. In some embodiments, the synthesizer circuitry 206d may be a fractional N/N+1 synthesizer.

In some embodiments, frequency input may be provided by a voltage controlled oscillator (VCO), although that is not a requirement. Divider control input may be provided by either the baseband circuitry 204 or the applications processor 202 depending on the desired output frequency. In some embodiments, a divider control input (e.g., N) may be determined from a look-up table based on a channel indicated by the applications processor 202.

Synthesizer circuitry 206d of the RF circuitry 206 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+(e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 206d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency ($f_{LO}$). In some embodiments, the RF circuitry 206 may include an IQ/polar converter.

FEM circuitry 208 may include a receive signal path which may include circuitry configured to operate on RF signals received from one or more antennas 210, amplify the received signals and provide the amplified versions of the received signals to the RF circuitry 206 for further processing. FEM circuitry 208 may also include a transmit signal path which may include circuitry configured to amplify signals for transmission provided by the RF circuitry 206 for transmission by one or more of the one or more antennas 210.

In some embodiments, the FEM circuitry 208 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 206). The transmit signal path of the FEM circuitry 208 may include a power amplifier (PA) to amplify input RF signals (e.g., provided by RF circuitry 206), and one or more filters to generate RF signals for subsequent transmission (e.g., by one or more of the one or more antennas 210. The various circuitry may perform spatial processing or precoding on symbols to be transmitted before the symbols are provided to modulators that further process the symbols and provide them to one or more antennas for transmission. The circuitry may also provide similar functionality using the receive chain, but varied in order.

In some embodiments, the UE 200 may include additional elements such as, for example, memory/storage, display, camera, sensor, and/or input/output (I/O) interface as described in more detail below. In some embodiments, the UE 200 described herein may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the UE 200 may include one or more user interfaces designed to enable user interaction with the system and/or peripheral component interfaces designed to enable peripheral component interaction with the system. For example, the UE 200 may include one or more of a keyboard, a keypad, a touchpad, a display, a sensor, a non-volatile memory port, a universal serial bus (USB) port, an audio jack, a power supply interface, one or more antennas, a graphics processor, an application processor, a speaker, a microphone, and other I/O components. The display may be an LCD or LED screen including a touch screen. The sensor may include a gyro sensor, an accelerometer, a proximity sensor, an ambient light sensor, and a positioning unit. The positioning unit may communicate with components of a positioning network, e.g., a global positioning system (GPS) satellite.

The antennas 210 may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas 210 may be effectively separated to take advantage of spatial diversity and the different channel characteristics that may result.

Although the UE 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

Figure 3:
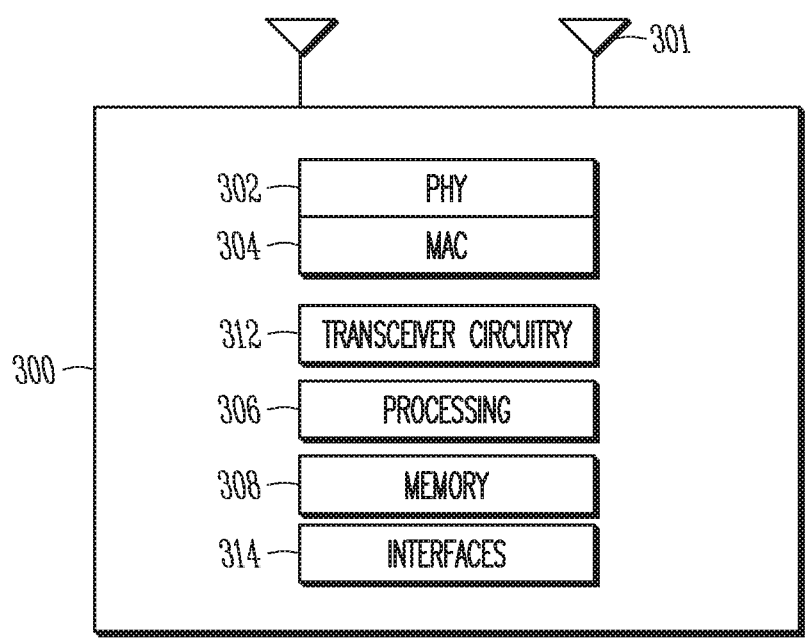
FIG. 3 illustrates a block diagram of a communication device in accordance with some embodiments.

FIG. 3 is a block diagram of a communication device in accordance with some embodiments. The device may be a UE or eNB, for example, such as the UE 102 or eNB 104 shown in FIG. 1. The physical layer circuitry 302 may perform various encoding and decoding functions that may include formation of baseband signals for transmission and decoding of received signals. The communication device 300 may also include medium access control layer (MAC) circuitry 304 for controlling access to the wireless medium. The communication device 300 may also include processing circuitry 306, such as one or more single-core or multi-core processors, and memory 308 arranged to perform the operations described herein. The physical layer circuitry 302, MAC circuitry 304 and processing circuitry 306 may handle various radio control functions that enable communication with one or more radio networks compatible with one or more radio technologies. The radio control functions may include signal modulation, encoding, decoding, radio frequency shifting, etc. For example, similar to the device shown in FIG. 2, in some embodiments, communication may be enabled with one or more of a WMAN, a WLAN, and a WPAN. In some embodiments, the communication device 300 can be configured to operate in accordance with 3GPP standards or other protocols or standards, including WiMax, WiFi, WiGig, GSM, EDGE, GERAN, UMTS, UTRAN, or other 3G, 3G, 4G, 5G, etc. technologies either already developed or to be developed. The communication device 300 may include transceiver circuitry 312 to enable communication with other external devices wirelessly and interfaces 314 to enable wired communication with other external devices. As another example, the transceiver circuitry 312 may perform various transmission and reception functions such as conversion of signals between a baseband range and a Radio Frequency (RF) range.

The antennas 301 may comprise one or more directional or omnidirectional antennas, including, for example, dipole antennas, monopole antennas, patch antennas, loop antennas, microstrip antennas or other types of antennas suitable for transmission of RF signals. In some MIMO embodiments, the antennas 301 may be effectively separated to take advantage of spatial diversity and the different channel characteristics that may result.

Although the communication device 300 is illustrated as having several separate functional elements, one or more of the functional elements may be combined and may be implemented by combinations of software-configured elements, such as processing elements including DSPs. and/or other hardware elements. For example, some elements may comprise one or more microprocessors, DSPs, FPGAs, ASICs, RFICs and combinations of various hardware and logic circuitry for performing at least the functions described herein. In some embodiments, the functional elements may refer to one or more processes operating on one or more processing elements. Embodiments may be implemented in one or a combination of hardware, firmware and software. Embodiments may also be implemented as instructions stored on a computer-readable storage device, which may be read and executed by at least one processor to perform the operations described herein.

Figure 4:
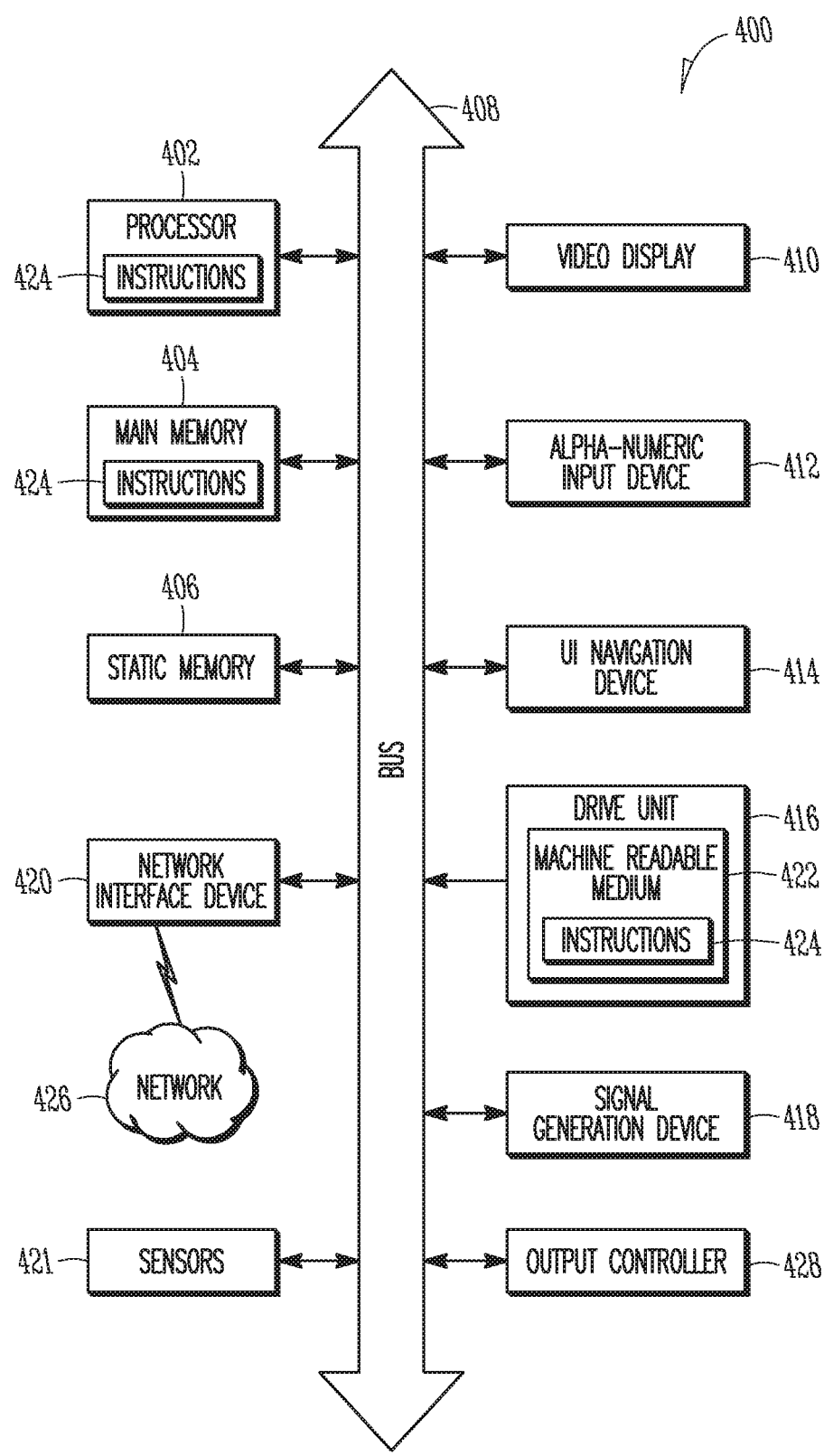
FIG. 4 illustrates another block diagram of a communication device in accordance with some embodiments.

FIG. 4 illustrates another block diagram of a communication device in accordance with some embodiments. In alternative embodiments, the communication device 400 may operate as a standalone device or may be connected (e.g., networked) to other communication devices. In a networked deployment, the communication device 400 may operate in the capacity of a server communication device, a client communication device, or both in server-client network environments. In an example, the communication device 400 may act as a peer communication device in peer-to-peer (P2P) (or other distributed) network environment. The communication device 400 may be a UE, eNB, PC, a tablet PC, a STB, a PDA, a mobile telephone, a smart phone, a web appliance, a network router, switch or bridge, or any communication device capable of executing instructions (sequential or otherwise) that specify actions to be taken by that communication device. Further, while only a single communication device is illustrated, the term "communication device" shall also be taken to include any collection of communication devices that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a communication device readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Communication device (e.g., computer system) 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The communication device 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The communication device 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The communication device 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 416 may include a communication device readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the communication device 400. In an example, one or any combination of the hardware processor 402, the main memory 404, the static memory 406, or the storage device 416 may constitute communication device readable media.

While the communication device readable medium 422 is illustrated as a single medium, the term "communication device readable medium" may include a single medium or multiple media (e.g., a centralized or distributed database, and/or associated caches and servers) configured to store the one or more instructions 424.

The term "communication device readable medium" may include any medium that is capable of storing, encoding, or carrying instructions for execution by the communication device 400 and that cause the communication device 400 to perform any one or more of the techniques of the present disclosure, or that is capable of storing, encoding or carrying data structures used by or associated with such instructions. Non-limiting communication device readable medium examples may include solid-state memories, and optical and magnetic media. Specific examples of communication device readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, communication device readable media may include non-transitory communication device readable media. In some examples, communication device readable media may include communication device readable media that is not a transitory propagating signal.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as WiFi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to wirelessly communicate using at least one of single-input multiple-output (SIMO), MIMO, or multiple-input single-output (MISO) techniques. In some examples, the network interface device 420 may wirelessly communicate using Multiple User MIMO techniques. The term "transmission medium" shall be taken to include any intangible medium that is capable of storing, encoding or carrying instructions for execution by the communication device 400, and includes digital or analog communications signals or other intangible medium to facilitate communication of such software.

As discussed above, the next generation 5G wireless communication systems is intended to satisfy diverse multidimensional requirements driven by different services and applications and may be based on 3GPP LTE-A with additional Radio Access Technologies (RATs). Beamforming is one technology to improve the signal quality and reduce the inter user interference by directing the narrow radiate beaming toward the target users. Transmit (Tx) beamforming may be used by a 5G eNB to send UE-specific transmissions to different 5G UEs. In 5G systems, for broadcast signals, Tx beam sweeping or aggregated Tx-beam-based transmissions may help ensure sufficient coverage for 5G cells.

For effective beamforming, the eNB and/or UE may have multiple antenna arrays that may be used with various antenna groupings and with various signal modifications for each grouping to produce a plurality of Tx beams from different antenna ports. Each Tx beam (eNB) and Rx beam (UE) may be defined for one or more antennas and may correspond to a different transmission signal direction. The eNB and UE may communicate using single or multi-beam operation (multiple Tx/Rx beam links each forming an active link). The eNB and UE may transmit multiple layers with codebook-based or non-codebook-based precoding techniques. In various embodiments, only a single active link may exist between the eNB and UE or multiple active links may be associated with a single UE.

Figure 5:
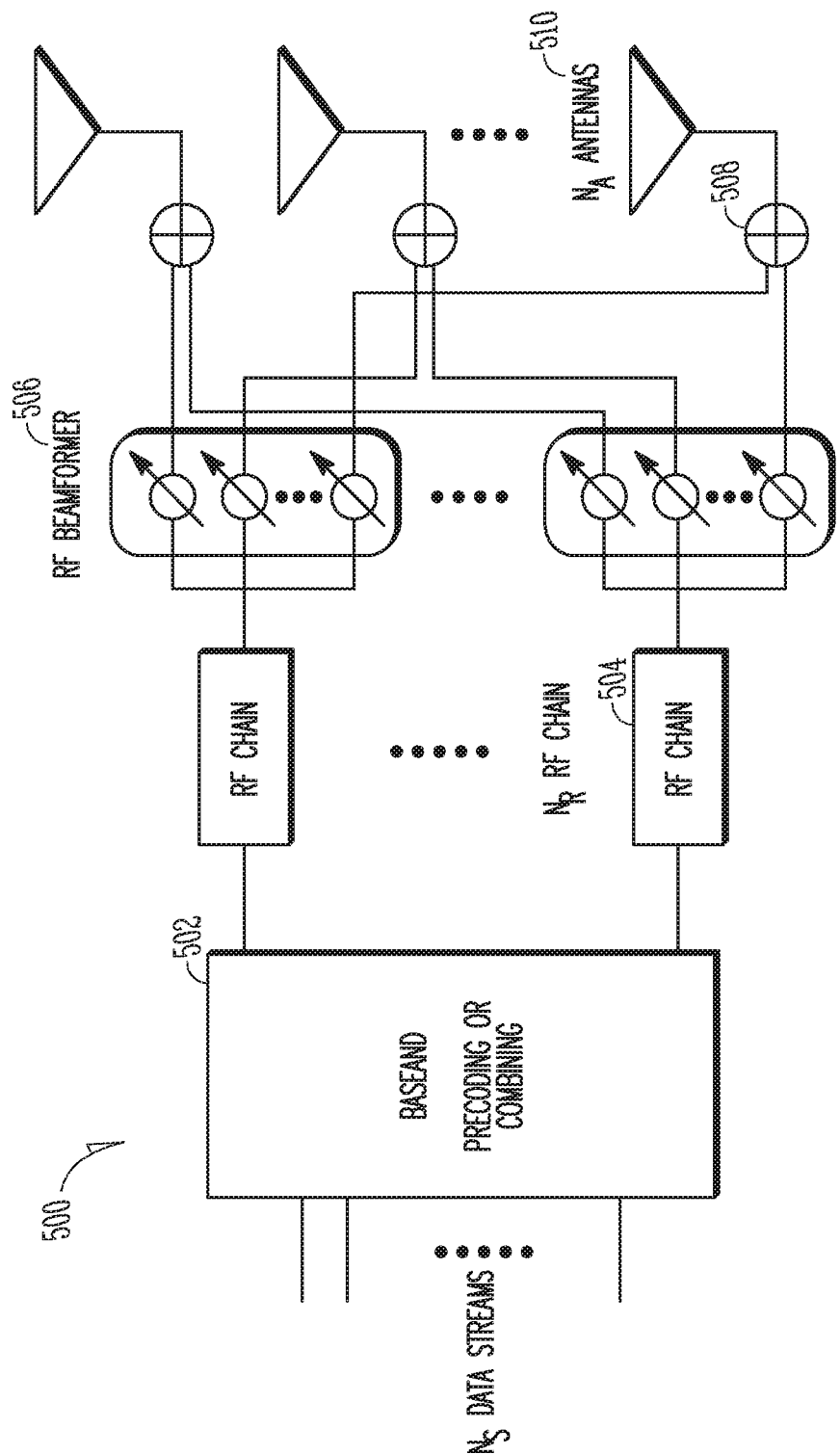
FIG. 5 illustrates a high level block diagram of a hybrid beamforming front-end architecture in accordance with some embodiments.

FIG. 5 illustrates a high level block diagram of a hybrid beamforming front-end architecture in accordance with some embodiments. The front-end architecture 500 may be provided in any of the UEs or eNBs shown in FIGS. 1-4. Other components may be present, but are not shown for simplicity. The front-end architecture 500 may comprise baseband circuitry 502, RF chains 504, RF beamformers 506, combiners 508 and antennas 510. Traditional beamforming may be performed at baseband only. Hybrid beamforming may instead rely on RF precoding to reduce the number of RF chains 504.

Precoding uses the baseband circuitry 502 to weight different data streams received by the baseband circuitry 502. The weighting, as indicated, may occur at baseband rather than at intermediate frequencies or RF. The precoded signals of the data streams may then be supplied to the RF chains 504, where the signals may be amplified using one or more amplifiers (such as a power amplifier), filtered using one or more low-pass or band-pass filters for example, and upconverted to RF frequencies using mixers and a local oscillator for example, among others. Each RF chain 504 may be associated with a different set of precoded signals. The number of RF chains 504 and the number of data streams supplied to the baseband circuitry 502 may be different.

The RF signals from the RF chains 504 may then be supplied to the RF beamformer 506. Each RF beamformer 506 may provide multiple outputs containing the same data with different weights attached to each output. The signals from the RF beamformer 506 may then be added at a series of combiners 508. Each combiner 508 may combine a unique signal from each RF beamformer 506. Thus, in some embodiments no signal from any RF beamformer 506 may be supplied to multiple combiners 508. The signals from each combiner 508 may then be supplied to a different antenna 510, where the signals are transmitted. In some embodiments, the combiners 508 may be replaced with switches. In either case, each UE may be associated with a different weighting and thus beam.

The antenna patterns associated with each of the RF chains 506 are directional and thus may be relatively narrow as determined by the weights in the RF beamformer 506. In some embodiments, the RF (analog) beamformer weights may be wideband and phase-only, i.e., only the phase of the various RF chains 506 may be adjusted by each RF beamformer 506.

Figure 6:
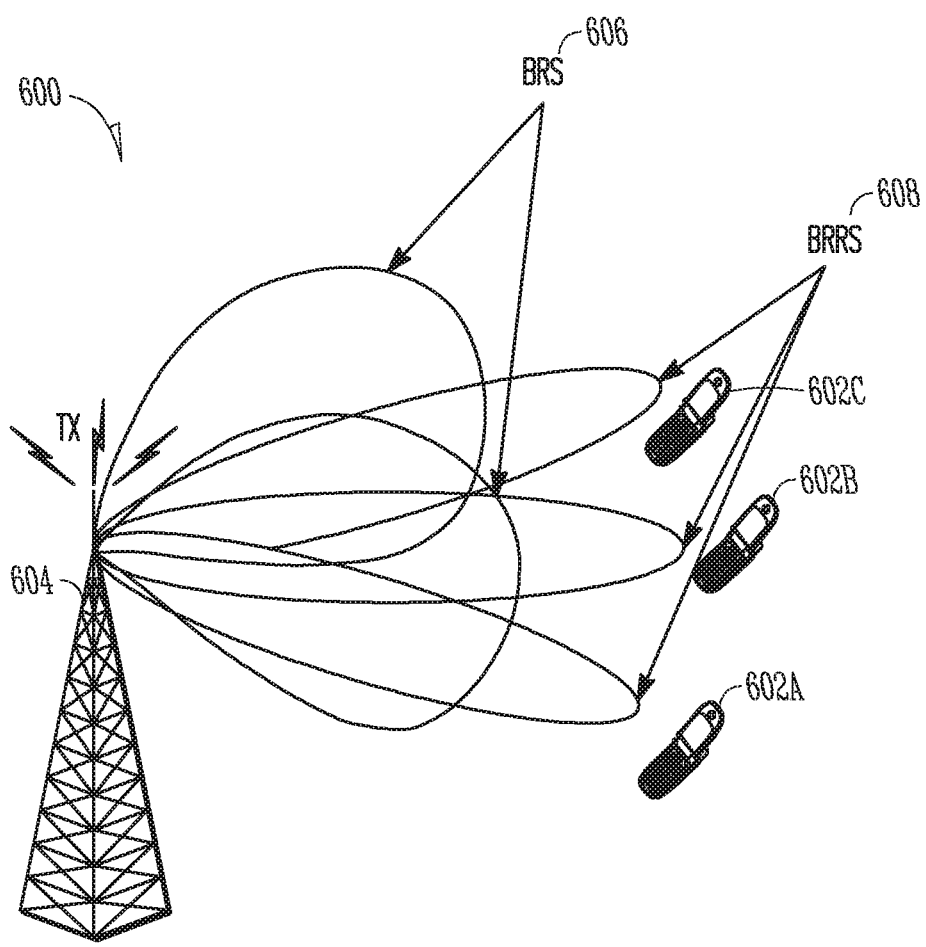
FIG. 6 illustrates beamforming reference signals in accordance with some embodiments.

Each beam formed by the arrangement in FIG. 5 may be associated with different reference signals, including Beamformed Reference Signals (BRS), Beam Refinement Reference Signals (BRRS), channel state information reference signal (CSI-RS) and UE-specific reference signals (such as demodulation reference signals or DMRS). The DMRS may be uplink transmissions from the UE that are used for coherent demodulation by the eNB and associated with transmission of PUSCH or PUCCH. In 5G, however, the DMRS may be downlink transmissions from the eNB that are used for coherent demodulation of the ePBCH by the UE. The BRS and BRRS (if transmitted) are specific to beamforming. FIG. 6 illustrates beamforming reference signals in accordance with some embodiments.

In particular, cell-specific BRS 606 broadcast from the eNB 604 to all UEs 602a, 602b, 602c in a cell may be located in different symbols within a specific BRS subframe. The eNB 604 may transmit different BRS 606 in the xPDSCH on the different antennas. The different BRS 606 may use different sequences to enable the UE 602a, 602b, 602c to distinguish between the various beamformed reference signals. The sequences may be similar to Secondary Synchronization Signal (xSSS) sequences, which may be an interleaved concatenation of two length-31 binary sequences scrambled with a scrambling sequence given by the Primary Synchronization Signal (xPSS). In some embodiments, the BRS 606 transmitted from each eNB antenna port may be a cyclic shift of a base sequence. The BRS 606 may be a broadcast signal that is transmitted periodically on all Tx beams in a BRS subframe. The UE may to measure the BRS receive power (BRSRP) for multiple BRS instances (i.e., over multiple BRS subframes) and subsequently transmit BRSRP information as well as identity information of the beam (BRS ID). This information, for example, may enable the eNB 604 to determine the best direction for transmitting data to the UE 602a, 602b, 602c. The BRS ID can be determined by the BRS index, the BRS resource index, and/or a subframe index for the BRS. The BRS ID may identify a set of time/frequency resources used for transmitting the corresponding BRS and thus may uniquely identify a particular Tx beam. The BRS 606 may be optimized to maximize, or provide a tradeoff between, one or more of coverage, access latency and beamforming gain.

The UE-specific BRRS 608 may be used for fast Rx beam refinement. In particular, the Rx beam direction may be dynamically adjusted in response to the channel conditions measured by the UE, which may be beneficial when high frequency band signals, for example, 28 GHz, 37 GHz, 39 GHz and 64-71 GHz, are used. The BRRS 608 may be transmitted on the same Tx beam as data rather than having to wait for the next BRS subframe. The BRRS 608 may be in temporal proximity with the data OFDM symbols (e.g., within 6, 13 or 25 ms) and may establish an association between the BRRS 608 and the data on the same Tx beam. Multiple BRRS symbols may be transmitted using the same Tx beam. The BRRS 608 can be generated within one OFDM symbol using frequency domain down-sampling that changes the sampling band edge and scales the amplitude of the sampled signal. By the down-sampling, the number of time-domain samples can be reduced so that the subcarrier spacing can be increased. The BRRS 608 may be generated using a Zadoff-Chu sequence. The sequence may be a function of slot number, cyclic shift, virtual cell ID, the number of antenna ports, an antenna-port-to-cyclic-shift mapping function where the cyclic shift is determined by a hash table, and the number of BRRS subcarriers. The sequence may be mapped to resource elements on antenna ports as a function of the number of BRRS sequence replicas in one symbol, the total number of downlink resource blocks and the subcarrier number per resource block. The BRRS 608 can be mapped to multiple BRRS symbols with repeated pattern and sequence, where the number of BRRS symbols may be defined by the system or indicated by the DCI and may be transmitted in one or more OFDM symbols.

After training the Tx and Rx beams using the BRS and perhaps the BRRS, the eNB may transmit control and data to the UE, respectively in the xPDCCH and xPDSCH. The UE may search all locations (candidates) within the xPDCCH region. The xPDCCH search space may UE-specific or common and may depend on the aggregation level, the UE may thus monitor both UE-specific and common search space for a xPDCCH. The common search space may carry the DCIs that are common for all UEs, e.g., system information, paging and PRACH responses, which have different RNTIs. The UE-specific search space may carry DCIs for UE-specific allocations using a RNTI assigned to the UE.

In some circumstances, when the UE sweeps through the common search space of the xPDCCH, the eNB may repeat each Tx beam transmission multiple times to permit the UE to determine the BRS adequately and eventually determine the optimal Rx beam. This repetition, however, may increase system overhead and thereby reduce spectrum efficiency. This becomes problematic in various circumstances after beam training, such as when the xPDCCH contains 5G system information block (xSIB) scheduling information and the UE is to receive multiple Tx beams containing the same information. As discussed above, repeated transmission may be used when Tx beam sweeping is applied for the xPDCCH with a common search space. This may increase system overhead, thereby reducing spectrum efficiency, by an amount that is undesirable.

To reduce system overhead, a 5G xPDCCH-less operation can be implemented for transmission of the 5G system information block (xSIB). To support standalone deployment in a 5G system, the xSIB may be carried within an ePBCH. The xSIB may be transmitted periodically through Tx beam sweeping. An xSIB may be transmitted in a subframe at a subframe offset or starting subframe. The period and subframe offset for xSIB transmissions may be configured by the eNB using various transmissions, such as an xMIB or an xPSS, xSSS, and/or a BRS transmission.

In the design of the ePBCH for a 5G standalone system, the same Tx beams may be applied on the ePBCH transmission on K consecutive symbols, where K is an integer that is greater than 1. K may be, for example, 2. According to this transmission scheme, a single ePBCH transmission may span K OFDM symbols using the same Tx beams. When Tx diversity is used for the ePBCH transmission, the DMRS from the eNB associated with the ePBCH transmission for two antenna ports (APs) in two OFDM symbols can be multiplexed using Code Division Multiplexing (CDM).

In some embodiments, a DMRS pattern associated with the ePBCH, different antenna ports can use different orthogonal cover codes (OCC). For instance, for antenna port 0, an OCC with [1 1] may be applied, while for antenna port 1, an OCC with [1 −1] may be applied. To further improve the frequency offset tracking performance, the ePBCH data symbol on two consecutive OFDM symbols using same Tx beams can be same. A separate CRC can be defined for ePBCH transmission on each OFDM symbol. In this case, the UE may calculate the phase difference on the ePBCH resource elements between two OFDM symbols to estimate the frequency offset. In addition, a scrambling seed can be defined for transmission of the ePBCH on different OFDM symbols as a function of ePBCH transmission blocks. Thus, for example, every K OFDM symbols may be scrambled using a different scrambling seed.

Figure 7:
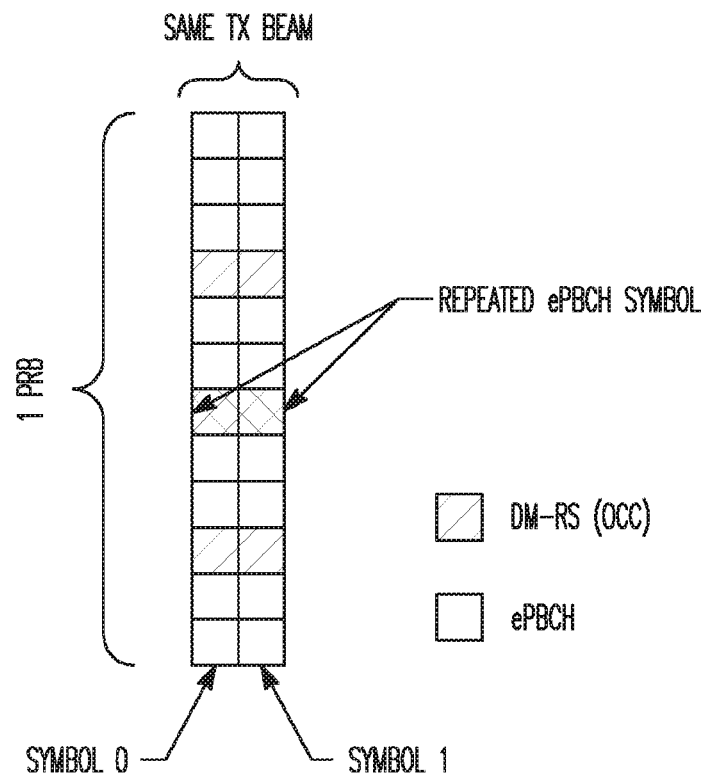
FIG. 7 illustrates transmission scheme for an ePBCH in accordance with some embodiments.

FIG. 7 illustrates transmission scheme for an ePBCH in accordance with some embodiments. The transmission scheme shown may include signals transmitted by any of the eNBs and received by the UEs shown in FIGS. 1-6 and signals transmitted by any of the UEs and received by the eNBs shown in FIGS. 1-6. FIG. 7 shows transmissions of a single PRB that may be associated with a single Tx beam among a plurality of PRBs transmitted by the eNB. The same Tx beams may be applied for the ePBCH transmission on two consecutive OFDM symbols. Further, as illustrated in FIG. 7, the same ePBCH symbol may be transmitted on two OFDM symbols on the same subcarrier of the same Tx beam. As shown, the DMRS associated with the ePBCH may be disposed in consecutive OFDM symbols on a different subcarrier of the same PRB as the ePBCH.

Figure 8:
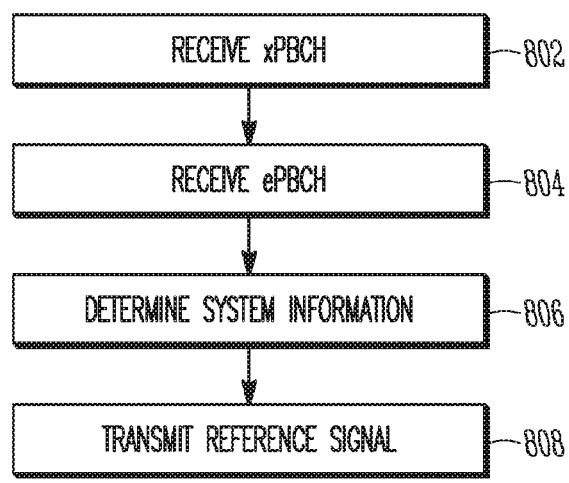
FIG. 8 is a flowchart of a method of communicating system information in accordance with some embodiments.

FIG. 8 is a flowchart of a method of communicating system information in accordance with some embodiments. FIG. 8 describes communications that may occur at one or more of the UEs shown in FIGS. 1-6. At operation 802, the UE may receive and decode an xPBCH. The xPBCH may contain a limited number of system and other parameters used for initial access of the cell in which the UE is disposed. The parameters may include the most significant eight-bits of the System Frame Number (SFN), the downlink system bandwidth (e.g., 1.4 MHz, 3 MHz, 5 MHz, 10 MHz, 15 MHz, 20 MHz, or, with carrier aggregation, up to about 100 MHz), and the Physical Hybrid Automatic Repeat Request (ARQ) Indicator Channel structure, among others.

At operation 804, the UE may receive and decode an ePBCH. In some embodiments, a 1:1 Tx beam association can be defined between the xPBCH and the ePBCH to allow the UE to monitor only the ePBCH transmission on a particular timing instance. In one example, 14 Tx beams can be used for the xPBCH in one subframe. The 14 Tx beams can be single beam or aggregated beams from multiple transmission panels of the eNB. When the ePBCH is transmitted in two OFDM symbols using the same Tx beams, a total of 7 Tx beams can be used for ePBCH transmission in one subframe.

In one example, the transmission periodicity for the xPBCH and ePBCH may be 5 ms and 40 ms, respectively. In this case, if the Tx beam sweeping time for the xPBCH is 10 ms, then 2 Tx beam groups in total may be used for the xPBCH transmission, each Tx beam group may include 14 Tx beams and each Tx beam may be used in one (different) OFDM symbol. If two OFDM symbols are used for ePBCH transmission, two subframes may then be used for one Tx beam group. Based on this example, the UE may follow the timing instance for ePBCH decoding. A number of the Tx beams decoded for a particular OFDM symbol may thus be dependent on a total number of Tx beams, a beam sweeping time for the Tx beams and a transmission periodicity of the xPBCH and ePBCH.

In a first example, when the UE decodes the xPBCH in the $0^{th}$ subframe and the $l^{th}$ OFDM symbol (l<7), the UE may attempt to decode the ePBCH in $n_f$ mod 16=0, $1^{st}$ subframe and $(2l)^{th}$ OFDM symbol. Here $n_f$ is the radio frame number. If the UE decodes the xPBCH in the $0^{th}$ subframe and the $l^{th}$ OFDM symbol (l≥7), the UE may attempt to decode the ePBCH in $n_f$ mod 16=4, $1^{st}$ subframe and $(2 \cdot (l-7))^{th}$ OFDM symbol. If the UE decodes the xPBCH in the $25^{th}$ subframe and the $l^{th}$ OFDM symbol (l<7), the UE may attempt to decode the ePBCH in $n_f$ mod 16=8, $1^{st}$ subframe and $(2l)^{th}$ OFDM symbol. If the UE decodes the xPBCH in the $25^{th}$ subframe and the $l^{th}$ OFDM symbol (l≥7), the UE may attempt to decode the ePBCH in $n_f$ mod 16=12, $1^{st}$ subframe and $(2 \cdot (l-7))^{th}$ OFDM symbol. When the xPBCH occurs in one of a $0^{th}$ or a 25th subframe, the xPBCH and ePBCH may be decoded from the same group of Tx beams. In addition, the ePBCH may be associated with the xPBCH such that the frame number, subframe number and OFDM symbol number of the ePBCH decoded is dependent on a subframe number and OFDM symbol number of the xPBCH decoded.

At operation 806, the UE may determine system information from the xPBCH and ePBCH. In some embodiments, the PDCCH may not carry system information (xSIB), which may instead be carried by one or both of the xPBCH and ePBCH. The xSIB to support standalone mode may be transmitted on the ePBCH via two antenna ports. The ePBCH may be transmitted using the same multiple beams in $N_{symb}^{ePBCH}$ OFDM symbols, where $N_{symb}^{ePBCH}=2$. The ePBCH is transmitted on a predefined or configured subframe. The essential system information for initial cell attachment and radio resource configuration may be included in the SIB.

The block of bits $b(0), \ldots b(M_{bit}-1)$ to be transmitted on the ePBCH may be scrambled with a cell-specific sequence prior to modulation, where $M_{bit}$ is the number of bits transmitted on the ePBCH. In some embodiments, $M_{bit}$ may equal 2000. The result of the scrambling may be a block of scrambled bits $\tilde{b}(0), \ldots \tilde{b}(M_{bit}-1)$ according to $\tilde{b}(i)=(b(i)+c(i))$ mod 2 where the scrambling sequence $c(i)$ is given by 3GPP TS 36.211, clause 7.2. The scrambling sequence may be initialized with:

$$c_{init}=2^{10}\cdot(7\cdot(\bar{n}_s+1)+\lfloor l/N_{symb}^{ePBCH}\rfloor+1)\cdot(2\cdot N_{ID}^{cell}+1)+2\cdot N_{ID}^{cell}+1$$

where $\bar{n}_s=n_s$ mod 20, $n_s$ is the slot number within a radio frame and l is the OFDM symbol number within one subframe, and $l=0, 1, 2, \ldots 13$.

The block of scrambled bits $\tilde{b}(0), \ldots \tilde{b}(M_{bit}-1)$ may be modulated as described in 3GPP TS 36.211, clause 7.1, resulting in a block of complex-valued modulation symbols $d(0), \ldots d(M_{symb}-1)$. Table 1 specifies the modulation mappings applicable for the ePBCH. In particular, Table 1 specifies that the ePBCH may use QPSK.

TABLE 1 ePBCH modulation schemes.

| Physical channel | Modulation schemes |
|---|---|
| ePBCH | QPSK |

The block of modulation symbols $d(0), \ldots d(M_{symb}-1)$ may be mapped to layers according to one of 3GPP TS 36.211, clause 6.3.3.3 with $M_{symb}^{(0)}=M_{symb}$ and precoded according to 3GPP TS 36.211, clause 6.3.4.2, resulting in a block of vectors $y(i)=[y^{(0)}(i) \ldots y^{(P-1)}(i)]^T$, $i=0, \ldots M_{symb}-1$, where $y^{(p)}(i)$ represents the signal for antenna port p and where $p=p_0, p_1$.

The ePBCH transmission periodicity is configured by ePBCH, which is given by Table 2.

TABLE 2 ePBCH Transmission periodicity

| Indication Bit | ePBCH transmission periodicity | $T_{ePBCH}$ |
|---|---|---|
| 00 | ePBCH transmission is off | N/A |
| 01 | 40 ms | 4 |
| 10 | 80 ms | 8 |
| 11 | 160 ms | 16 |

The configured radio frame and subframe for ePBCH transmission are listed in Table 3.

TABLE 3 ePBCH Transmission configuration

| Physical cell ID | Configured radio frame for ePBCH transmission | Configured subframe frame in the radio frame for ePBCH transmission |
|---|---|---|
| $N_{ID}^{cell}$ mod = 0 | $n_f$ mod $T_{ePBCH}$ = 0 | 1st |
| $N_{ID}^{cell}$ mod = 1 | $n_f$ mod $T_{ePBCH}$ = 0 | 26th |
| $N_{ID}^{cell}$ mod = 2 | $n_f$ mod $T_{ePBCH}$ = 1 | 1st |

In each OFDM symbol of the configured subframes, the block of complex-valued symbols $y(0), \ldots, y(M_{symb}-1)$ may be transmitted via multiple (e.g., two) antenna ports. The block of complex-valued symbols may be transmitted using identical analog beams in $N_{symb}^{ePBCH}$ OFDM symbols.

The block of complex-valued symbols transmitted in each OFDM symbol may be mapped in increasing order of the index k, excluding DMRS associated with the ePBCH. The resource-element indices may be given by:

$$k=6\cdot k'+k''$$

$$k'=0,1,2,\ldots 2\cdot N_{RB}^{DL}-1$$

$$k''=0,1,2,3,4,5$$

$$l=0,1,2,\ldots,12,13$$

where $N_{RB}^{DL}=100$.

For DMRS associated with the ePBCH transmission, the detailed design is described as follows. The DMRS associated with the ePBCH may be transmitted by the UE on the antenna port $p=\in\{p_0, p_1\}$. The analog beams for reference signal transmission may be identical with the analog beams for the ePBCH transmission in each OFDM symbol.

The reference-signal sequence $r_{l,n_s}(m)$ is defined by $$r_{l,n_s}(m) = \frac{1}{\sqrt{2}}(1-2\cdot c(2m)) + j\frac{1}{\sqrt{2}}(1-2\cdot c(2m+1)),$$

$$m = 0, 1, \ldots, 2\cdot N_{RB}^{DL}-1$$

where $N_{RB}^{DL}=100$, $n_s$ is the slot number within a radio frame and l is the OFDM symbol number within one subframe, and $l=0, 1, 2, \ldots 13$. The pseudo-random sequence $c(i)$ may be defined in 3GPP TS 36.211, clause 7.2. The pseudo-random sequence generator may be initialized with:

$$c_{init}=2^{10}\cdot(7\cdot(\bar{n}_s+1)+\bar{l}+1)\cdot(2\cdot N_{ID}^{cell}+1)+2\cdot N_{ID}^{cell}+1$$

$$\bar{n}_s=n_s \text{ mod } 20$$

$$\bar{l}=l \text{ mod } 7$$

at the start of each OFDM symbol.

The reference signal sequence $r_{l,n_s}(m)$ shall be mapped to complex-valued modulation symbols $a_{k,l}^{(p)}$ used as reference symbols for antenna port p in each OFDM symbol according to $$a_{k,l}^{(p)}=\bar{w}_p(l')r_{l,n_s}(m)$$

$$k=6\cdot m+2$$

$m=0,1,2,\ldots 2\cdot N_{RB}^{DL}-1$ $l=0,1,2,\ldots,12,13$ $l'=l \bmod 2$ where $N_{RB}^{DL}=100$.

TABLE 4

| The sequence $\bar{w}_p(i)$ | |
| --- | --- |
| Antenna port p | $[\bar{w}_p(0) \ \bar{w}_p(1)]$ |
| $p_0$ | [+ 1 + 1] |
| $p_1$ | [+ 1 − 1] |

At operation 808, the eNB may encode and transmit a reference signal, such as a DMRS. The DMRS may be transmitted in the same PRB as the ePBCH, but in one or more different subcarriers. The DMRS may be transmitted in the same consecutive symbols as the ePBCH.

EXAMPLES

Example 1 is an apparatus of user equipment (UE), the apparatus comprising: a memory; and processing circuitry in communication with the memory and arranged to: demodulate a reference signal associated with an extended physical broadcast channel (ePBCH); decode, dependent on the reference signal, the ePBCH in an ePBCH transmission block on different transmission (Tx) beams from an evolved NodeB (eNB), a first Tx beam of the Tx beams arranged to span consecutive orthogonal frequency division multiplexed (OFDM) symbols, the ePBCH comprising a system information block (xSIB); and determine system information from the ePBCH.

In Example 2, the subject matter of Example 1 optionally includes, wherein: the reference signal is a demodulation reference signal (DMRS) associated with the ePBCH; and the processing circuitry is further arranged to use different orthogonal cover codes (OCCs) to demodulate the DMRS from different antenna ports (APs).

In Example 3, the subject matter of any one or more of Examples 1-2 optionally include, wherein: the consecutive OFDM symbols comprise a same ePBCH symbol.

In Example 4, the subject matter of Example 3 optionally includes, wherein the processing circuitry is further arranged to at least one of: perform separate cyclic redundancy checks (CRC) for the ePBCH symbols on the consecutive OFDM symbols, or calculate a phase difference on ePBCH resource elements between the consecutive OFDM symbols to estimate a frequency offset between the consecutive OFDM symbols.

In Example 5, the subject matter of any one or more of Examples 1-4 optionally include, wherein: consecutive OFDM symbols of different ePBCH transmission blocks are scrambled using different scrambling seeds, each scrambling seed a function of an associated ePBCH transmission block; and the processing circuitry is further arranged to use a particular scrambling seed to descramble and decode an associated ePBCH.

In Example 6, the subject matter of any one or more of Examples 1-5 optionally include, wherein the processing circuitry is further arranged to: decode a physical broadcast channel (xPBCH) that occurs in one of a 0th or a 25th subframe, the xPBCH and ePBCH decoded from a same set of Tx beams, the ePBCH associated with the xPBCH such that a frame number, subframe number and OFDM symbol number of the ePBCH decoded is dependent on a subframe number and OFDM symbol number of the xPBCH decoded.

In Example 7, the subject matter of Example 6 optionally includes, wherein: a number of the Tx beams decoded by the processing circuitry for a particular OFDM symbol is dependent on a total number of Tx beams, a beam sweeping time for the Tx beams and a transmission periodicity of the xPBCH and ePBCH.

In Example 8, the subject matter of any one or more of Examples 1-7 optionally include, wherein: the xSIB supports a standalone mode and is decoded by the processing circuitry on the ePBCH from two antenna ports.

In Example 9, the subject matter of any one or more of Examples 1-8 optionally include, wherein the processing circuitry is further arranged to: decode a block of scrambled bits on the ePBCH, where $M_{bit}$ is a number of bits transmitted on the ePBCH, the block of scrambled bits being a block of bits scrambled with a cell-specific sequence prior to modulation to result in.

In Example 10, the subject matter of Example 9 optionally includes, wherein: the scrambling cell-specific sequence is initialized with: $C\_init=2^10\cdot(7\cdot(n\_s+1)+\lfloor 1/N\_sym-b^ePBCH\rfloor+1)\cdot(2\cdot N\_ID^cell+1)+2\cdot N\_ID^cell+1$ where $n\_s = n\_s \bmod 20$; is a slot number within a radio frame, l is a OFDM symbol number within one subframe, and $l=0, 1, 2, \ldots, 13$.

In Example 11, the subject matter of any one or more of Examples 1-10 optionally include, wherein: the reference signal is a demodulation reference signal (DMRS), the DMRS arranged to span consecutive OFDM symbols on a different subcarrier than the ePBCH and in a same physical resource block (PRB) as the ePBCH.

In Example 12, the subject matter of any one or more of Examples 1-11 optionally include, wherein: the reference signal is stored in the memory to decode the ePBCH; and the apparatus further comprises an antenna configured to provide communications between the UE and the eNB.

Example 13 is an apparatus of an evolved NodeB (eNB) comprising: a memory; and processing circuitry in communication with the memory and arranged to: encode, for transmission to a user equipment (UE), a PBCH on different transmission (Tx) beams; encode, for transmission to the UE, an extended physical broadcast channel (ePBCH) in an ePBCH transmission block on the different Tx beams, the ePBCH arranged to span consecutive orthogonal frequency division multiplexed (OFDM) symbols on a same subcarrier, the ePBCH associated with the PBCH; and generate, for transmission to the UE, a reference signal arranged to span the consecutive OFDM symbols on a different subcarrier than the ePBCH and in a same physical resource block (PRB) as the ePBCH.

In Example 14, the subject matter of Example 13 optionally includes, wherein: the signal is a demodulation reference signal (DMRS) from different antenna ports (APs) and having different orthogonal cover codes (OCCs).

In Example 15, the subject matter of any one or more of Examples 13-14 optionally include, wherein: the consecutive OFDM symbols comprise a same ePBCH symbol.

In Example 16, the subject matter of any one or more of Examples 13-15 optionally include, wherein the processing circuitry is further arranged to: scramble consecutive OFDM symbols of different ePBCH transmission blocks using different scrambling seeds, each scrambling seed a function of an associated ePBCH transmission block.

In Example 17, the subject matter of any one or more of Examples 13-16 optionally include, wherein the processing circuitry is further arranged to: encode a physical broadcast channel (xPBCH) that occurs in one of a 0th or a 25th subframe, the xPBCH and ePBCH decoded from a same set of Tx beams, the ePBCH associated with the xPBCH such that a frame number, subframe number and OFDM symbol number of the ePBCH decoded is dependent on a subframe number and OFDM symbol number of the xPBCH decoded.

In Example 18, the subject matter of Example 17 optionally includes, wherein: a number of the Tx beams decoded by the processing circuitry for a particular OFDM symbol is dependent on a total number of Tx beams, a beam sweeping time for the Tx beams and a transmission periodicity of the xPBCH and ePBCH.

In Example 19, the subject matter of any one or more of Examples 13-18 optionally include, wherein: the ePBCH comprises a system information block (xSIB) that supports a standalone mode and is configured to be transmitted two antenna ports, a physical downlink control channel (PDCCH) and physical downlink shared channel (PDSCH) being free from the xSIB.

In Example 20, the subject matter of any one or more of Examples 13-19 optionally include, wherein the processing circuitry is further arranged to: encode a block of scrambled bits for transmission on the ePBCH, where Mbit is a number of bits transmitted on the ePBCH, the block of scrambled bits being a block of bits scrambled with a cell-specific sequence prior to modulation to result in.

In Example 21, the subject matter of Example 20 optionally includes, wherein: the scrambling cell-specific sequence is initialized with: $C\_init=2^{10} \cdot (7 \cdot (\bar{n}\_s+1) + \lfloor 1/N\_sym-b^{\hat{}}ePBCH \rfloor + 1) \cdot (2 \cdot N\_ID^{\hat{}}cell+1) + 2 \cdot N\_ID^{\hat{}}cell+1$
where $\bar{n}\_s = n\_s \mod 20$; is a slot number within a radio frame, l is a OFDM symbol number within one subframe, and l=0, 1, 2, . . . , 13.

In Example 22, the subject matter of Example undefined optionally includes A computer-readable storage medium that stores instructions for execution by one or more processors of a user equipment (UE), the one or to more processors to configure the UE to: decode a physical broadcast channel (xPBCH) that occurs in one of a 0th or a 25th subframe; and decode an extended physical broadcast channel (ePBCH) in an ePBCH transmission block on different transmission (Tx) beams, the ePBCH arranged to span consecutive symbols on a same subcarrier and comprising a same ePBCH symbol, the ePBCH comprising a system information block (xSIB), the xPBCH and ePBCH decoded from a same set of Tx beams, the ePBCH associated with the xPBCH such that a frame number, subframe number and symbol number of the ePBCH is dependent on a subframe number and symbol number of the xPBCH.

In Example 23, the subject matter of Example 22 optionally includes, wherein: a number of the Tx beams received for a particular symbol is dependent on a total number of Tx beams, a beam sweeping time for the Tx beams and a transmission periodicity of the xPBCH and ePBCH.

In Example 24, the subject matter of any one or more of Examples 22-23 optionally include, wherein the instructions further configure the UE to: use different orthogonal cover codes (OCCs) to demodulate a demodulation reference signal (DMRS) from different antenna ports (APs) in a same physical resource block as the ePBCH.

In Example 25, the subject matter of any one or more of Examples 22-24 optionally include, wherein: consecutive symbols of different ePBCH transmission blocks are scrambled using different scrambling seeds, each scrambling seed a function of an associated ePBCH transmission block, and the instructions further configure the UE to use a particular scrambling seed to descramble and decode an associated ePBCH.

In Example 26, the subject matter of Example undefined optionally includes An apparatus of a user equipment (UE), the apparatus comprising: means for decoding a physical broadcast channel (xPBCH) that occurs in one of a 0th or a 25th subframe; and means for decoding an extended physical broadcast channel (ePBCH) in an ePBCH transmission block on different transmission (Tx) beams, the ePBCH arranged to span consecutive symbols on a same subcarrier and comprising a same ePBCH symbol, the ePBCH comprising a system information block (xSIB), the xPBCH and ePBCH decoded from a same set of Tx beams, the ePBCH associated with the xPBCH such that a frame number, subframe number and symbol number of the ePBCH is dependent on a subframe number and symbol number of the xPBCH.

In Example 27, the subject matter of Example 26 optionally includes, wherein: a number of the Tx beams received for a particular symbol is dependent on a total number of Tx beams, a beam sweeping time for the Tx beams and a transmission periodicity of the xPBCH and ePBCH.

In Example 28, the subject matter of any one or more of Examples 26-27 optionally include, further comprising: means for using different orthogonal cover codes (OCCs) to demodulate a demodulation reference signal (DMRS) from different antenna ports (APs) in a same physical resource block as the ePBCH.

In Example 29, the subject matter of any one or more of Examples 26-28 optionally include, wherein: consecutive symbols of different ePBCH transmission blocks are scrambled using different scrambling seeds, each scrambling seed a function of an associated ePBCH transmission block, and the apparatus further comprises means for using a particular scrambling seed to descramble and decode an associated ePBCH.

In Example 30, the subject matter of Example undefined optionally includes A method of a user equipment (UE) obtaining an extended physical broadcast channel (ePBCH), the apparatus comprising: decoding a physical broadcast channel (xPBCH) that occurs in one of a 0th or a 25th subframe; and decoding an ePBCH in an ePBCH transmission block on different transmission (Tx) beams, the ePBCH arranged to span consecutive symbols on a same subcarrier and comprising a same ePBCH symbol, the ePBCH comprising a system information block (xSIB), the xPBCH and ePBCH decoded from a same set of Tx beams, the ePBCH associated with the xPBCH such that a frame number, subframe number and symbol number of the ePBCH is dependent on a subframe number and symbol number of the xPBCH.

In Example 31, the subject matter of Example 30 optionally includes, wherein: a number of the Tx beams received for a particular symbol is dependent on a total number of Tx beams, a beam sweeping time for the Tx beams and a transmission periodicity of the xPBCH and ePBCH.

In Example 32, the subject matter of any one or more of Examples 30-31 optionally include, the method further comprises: using different orthogonal cover codes (OCCs) to demodulate a demodulation reference signal (DMRS) from different antenna ports (APs) in a same physical resource block as the ePBCH.

In Example 33, the subject matter of any one or more of Examples 30-32 optionally include, wherein: consecutive symbols of different ePBCH transmission blocks are scrambled using different scrambling seeds, each scrambling seed a function of an associated ePBCH transmission block, and the method further comprises using a particular scrambling seed to descramble and decode an associated ePBCH.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus of user equipment (UE), the apparatus comprising:
   one or more processors arranged to:
      demodulate a reference signal associated with an extended physical broadcast channel (ePBCH);
      decode, dependent on the reference signal, the ePBCH in an ePBCH transmission block on different transmission (Tx) beams from a base station, a first Tx beam of the Tx beams arranged to span consecutive orthogonal frequency division multiplexed (OFDM) symbols, the ePBCH comprising a system information block (xSIB); and
      determine system information from the ePBCH.

2. The apparatus of claim 1, wherein:
   the reference signal is a demodulation reference signal (DMRS) associated with the ePBCH; and
   wherein the one or more processors are further arranged to use different orthogonal cover codes (OCCs) to demodulate the DMRS from different antenna ports (APs).

3. The apparatus of claim 1, wherein:
   the consecutive OFDM symbols comprise a same ePBCH symbol.

4. The apparatus of claim 3, wherein the one or more processors are further arranged to at least one of:
   perform separate cyclic redundancy checks (CRC) for the ePBCH symbols on the consecutive OFDM symbols; or
   calculate a phase difference on ePBCH resource elements between the consecutive OFDM symbols to estimate a frequency offset between the consecutive OFDM symbols.

5. The apparatus of claim 1, wherein:
   consecutive OFDM symbols of different ePBCH transmission blocks are scrambled using different scrambling seeds, wherein each scrambling seed is a function of an associated ePBCH transmission block; and
   wherein the one or more processors are further arranged to use a particular scrambling seed to descramble and decode an associated ePBCH.

6. The apparatus of claim 1, wherein the one or more processors are further arranged to:
   decode a physical broadcast channel (xPBCH) that occurs in one of a $0^{th}$ or a $25^{th}$ subframe, the xPBCH and ePBCH decoded from a same set of Tx beams, the ePBCH associated with the xPBCH such that a frame number, subframe number and OFDM symbol number of the ePBCH decoded is dependent on a subframe number and OFDM symbol number of the xPBCH decoded.

7. The apparatus of claim 6, wherein:
   a number of the Tx beams decoded by the one or more processors for a particular OFDM symbol is dependent on a total number of Tx beams, a beam sweeping time for the Tx beams and a transmission periodicity of the xPBCH and ePBCH.

8. The apparatus of claim 1, wherein:
   the xSIB supports a standalone mode and is decoded by the processing circuitry on the ePBCH from two antenna ports.

9. The apparatus of claim 1, wherein the one or more processors are further arranged to:
   decode a block of scrambled bits b (0), . . . ,b ($M_{bit}$−1) on the ePBCH, where $M_{bit}$ is a number of bits transmitted on the ePBCH, the block of scrambled bits being a block of bits b(0), . . . ,b($M_{bit}$−1) scrambled with a cell-specific sequence prior to modulation to result in b (0(i)=(b(i)+c(i))mod 2.

10. The apparatus of claim 9, wherein:
the scrambling cell-specific sequence is initialized with:

$$c_{init}=2^{10} \cdot (7 \cdot (\bar{n}_s+1)+\lfloor l/N_{symb}^{ePBCH} \rfloor+1) \cdot (2 \cdot N_{ID}^{cell}+1)+2 \cdot N_{ID}^{cell}+1$$

where $n_s$=ns mod 20; $n_s$ is a slot number within a radio frame, l is a OFDM symbol number within one subframe, and l=0, 1, 2, . . . , 13.

11. The apparatus of claim 1, wherein:
the reference signal is a demodulation reference signal (DMRS), the DMRS arranged to span consecutive OFDM symbols on a different subcarrier than the ePBCH and in a same physical resource block (PRB) as the ePBCH.

12. The apparatus of claim 1, wherein:
the reference signal is stored in the memory to decode the ePBCH; and
the apparatus further comprises an antenna configured to provide communications between the UE and the base station.

13. An apparatus of a base station comprising:
one or more processor arranged to:
encode, for transmission to a user equipment (UE), a PBCH on different transmission (Tx) beams;
encode, for transmission to the UE, an extended physical broadcast channel (ePBCH) in an ePBCH transmission block on the different Tx beams, the ePBCH arranged to span consecutive orthogonal frequency division multiplexed (OFDM) symbols on a same subcarrier, the ePBCH associated with the PBCH; and
generate, for transmission to the UE, a reference signal arranged to span the consecutive OFDM symbols on a different subcarrier than the ePBCH and in a same physical resource block (PRB) as the ePBCH.

14. The apparatus of claim 13, wherein:
the signal is a demodulation reference signal (DMRS) from different antenna ports (APs) and having different orthogonal cover codes (OCCs).

15. The apparatus of claim 13, wherein:
the consecutive OFDM symbols comprise a same ePBCH symbol.

16. The apparatus of claim 13, wherein the one or more processors are further arranged to:
scramble consecutive OFDM symbols of different ePBCH transmission blocks using different scrambling seeds, wherein each scrambling seed is a function of an associated ePBCH transmission block.

17. The apparatus of claim 13, wherein the one or more processors are further arranged to:
encode a physical broadcast channel (xPBCH) that occurs in one of a $0^{th}$ or a $25^{th}$ subframe, the xPBCH and ePBCH decoded from a same set of Tx beams, the ePBCH associated with the xPBCH such that a frame number, subframe number and OFDM symbol number of the ePBCH decoded is dependent on a subframe number and OFDM symbol number of the xPBCH decoded.

18. The apparatus of claim 17, wherein:
a number of the Tx beams decoded by the one or more processors for a particular OFDM symbol is dependent on a total number of Tx beams, a beam sweeping time for the Tx beams and a transmission periodicity of the xPBCH and ePBCH.

19. The apparatus of claim 13, wherein:
the ePBCH comprises a system information block (xSIB) that supports a standalone mode and is configured to be transmitted two antenna ports, a physical downlink control channel (PDCCH) and physical downlink shared channel (PDSCH) being free from the xSIB.

20. The apparatus of claim 13, wherein the one or more processors are further arranged to:
encode a block of scrambled bits b(0), . . . ,b(Mbit−1) for transmission on the ePBCH, where $M_{bit}$ is a number of bits transmitted on the ePBCH, the block of scrambled bits being a block of bits b(0), b($M_{bit}$−1) scrambled with a cell-specific sequence prior to modulation to result in b(i)=(b(i)+c(i))mod 2.

21. The apparatus of claim 20, wherein:
the scrambling cell-specific sequence is initialized with:

$$c_{init}=2^{10} \cdot (7 \cdot (\bar{n}_s+1)+\lfloor l/N_{symb}^{ePBCH} \rfloor+1) \cdot (2 \cdot N_{ID}^{cell}+1)+2 \cdot N_{ID}^{cell}+1$$

where n5=n5 mod 20; ns is a slot number within a radio frame, l is a OFDM symbol number within one subframe, and l=0, 1, 2, . . . , 13.

22. A non-transitory computer-readable storage medium that stores instructions for execution by one or more processors of a user equipment (UE), the one or more processors to configure the UE to:
decode a physical broadcast channel (xPBCH) that occurs in one of a $0^{th}$ or a $25^{th}$ subframe; and
decode an extended physical broadcast channel (ePBCH) in an ePBCH transmission block on different transmission (Tx) beams, the ePBCH arranged to span consecutive symbols on a same subcarrier and comprising a same ePBCH symbol, the ePBCH comprising a system information block (xSIB), the xPBCH and ePBCH decoded from a same set of Tx beams, the ePBCH associated with the xPBCH such that a frame number, subframe number and symbol number of the ePBCH is dependent on a subframe number and symbol number of the xPBCH.

23. The non-transitory storage medium of claim 22, wherein:
a number of the Tx beams received for a particular symbol is dependent on a total number of Tx beams, a beam sweeping time for the Tx beams and a transmission periodicity of the xPBCH and ePBCH.

24. The non-transitory storage medium of claim 22, wherein the instructions further configure the UE to:
use different orthogonal cover codes (OCCs) to demodulate a demodulation reference signal (DMRS) from different antenna ports (APs) in a same physical resource block as the ePBCH.

25. The non-transitory storage medium of claim 22, wherein:
consecutive symbols of different ePBCH transmission blocks are scrambled using different scrambling seeds, wherein each scrambling seed is a function of an associated ePBCH transmission block, and
the instructions further configure the UE to use a particular scrambling seed to descramble and decode an associated ePBCH.

* * * * *